United States Patent [19]

Morooka

[11] Patent Number: 5,200,925
[45] Date of Patent: Apr. 6, 1993

[54] SERIAL ACCESS SEMICONDUCTOR MEMORY DEVICE AND OPERATING METHOD THEREFOR

[75] Inventor: Yoshikazu Morooka, Hyogo, Japan

[73] Assignee: Mitsubishi Denki Kabushiki Kaisha, Tokyo, Japan

[21] Appl. No.: 728,323

[22] Filed: Jul. 8, 1991

Related U.S. Application Data

[63] Continuation of Ser. No. 337,703, Apr. 13, 1989, abandoned.

[30] Foreign Application Priority Data

Jul. 29, 1988 [JP] Japan .................. 63-191380

[51] Int. Cl.$^5$ .................. G11C 7/00; G11C 8/04
[52] U.S. Cl. .................. 365/219; 365/189.12; 365/230.03; 365/239; 365/240; 340/799; 340/800; 340/802
[58] Field of Search .......... 365/73, 189.4, 189.5, 365/189.12, 219, 230.03, 230.04, 234, 240, 233, 230.05; 340/749, 800, 801, 802, 803

[56] References Cited

U.S. PATENT DOCUMENTS

| 4,633,441 | 12/1986 | Ishimoto | 365/219 |
| 4,683,555 | 7/1987 | Pinkham | 365/215 |
| 4,855,959 | 8/1989 | Kobayashi | 365/239 |
| 4,943,947 | 7/1990 | Kobayashi | 365/189.12 |

FOREIGN PATENT DOCUMENTS 61-94295 5/1986 Japan .

OTHER PUBLICATIONS

Pinkham et al., "A 128K x 8 70 MHz Video RAM with Auto Register Reload," *IEEE International Circuits Conference*, Feb. 19, 1988, pp. 236 and 237.
Weste et al., *Principles of CMOS VLSI Design: A Systems Perspective*, 1985 (AT&T Bell), Ch. 5.4.5, pp. 212–215.
Stout et al., *Handbook of Microcircuit Design and Application*, 1986 (McGraw Hill), Ch. 4, pp. 4–12, & 4–13.

*Primary Examiner*—Joseph L. Dixon
*Assistant Examiner*—Jack A. Lane
*Attorney, Agent, or Firm*—Lowe, Price, Leblanc & Becker

[57] ABSTRACT

A serially accessible memory device includes a plurality of memory cell array blocks, a plurality of input buffers each separately provided for each cell array block for receiving different data in a data stream, a plurality of output buffers each separately provided for each memory cell array block, and a plurality of registers each separately provided for each memory cell array block for effectuating data transfer collectively to and from corresponding memory cell array blocks at the same time. All of the registers shift data received from corresponding input buffer to latch the data therein in response to a single clock signal in a data writing operation and also shift latched data received from corresponding array block to provide the data to corresponding output buffer in response to another single clock signal in data reading operation. Both the shifting clock signals are derived from an external clock defining the device operation rate.

28 Claims, 8 Drawing Sheets

SERIAL ACCESS SEMICONDUCTOR MEMORY DEVICE AND OPERATING METHOD THEREFOR

This application is a continuation of application Ser. No. 07/337,703 filed Apr. 13, 1989 now abandoned.

BACKGROUND OF THE INVENTION

1. Field of the Invention

The present invention relates generally to serial access semiconductor memory devices, and more particularly, to timing of serial data access among multiple memory array blocks. The invention has particular utility in the field of video memories (VRAMs).

2. Description of the Prior Art

Conventionally, an MOS memory (memory device having an MOS transistor as a component) has been used as a main storage of a computer. With recent development in semiconductor technology, a high-speed and large-capacity MOS memory has been achieved.

On the other hand, in recent years, an image signal has been digitally processed in the field of image processing, so that a high speed and large capacity memory capable of inputting and outputting pixel data at high speed has been required. A function required for a memory used in such a field of digital image processing comprises a high-speed serial access function. For example, when a video signal of an NTSC (National Television System Committee) system is sampled at 4 $f_{sc}$ ($f_{sc}$ is a chrominance subcarrier frequency; approximately 3.58 MHz), a video signal on a single horizontal scanning line is sampled into 256 pixel data. In a memory used for writing/reading such pixel data, a cycle time for one pixel must be 69.8 ns or less. In addition, if consideration is given to the uses such as non-interlace conversion (the video signal on the horizontal scanning line in video signals applied in an interlace manner is continuously read out two times, to be converted into a non-interlaced video signal), a cycle time of approximately 30 ns is required for a sampling frequency $8f_{sc}$.

In order to operate the MOS memory at such high speed, an approach has been conventionally used of frequency-dividing an external clock (obtained by multiplying a chrominance subcarrier if a video signal is digitally processed, for example to produce an internal clock, operating internal circuits in the memory by the frequency-divided clock in a time-divisional manner, respectively, and thus substantially decreasing an operation frequency of the memory.

FIG. 8 is a diagram showing schematically the entire structure of the conventional memory capable of performing a serial access operation.

In FIG. 8, a memory cell array storing information is divided into two array blocks 10 and 11 by way of example. Each of the memory cell array blocks 10 and 11 has a plurality of memory cells arranged in rows and columns.

In order to write/read data to/from the memory cell array block 10, there are provided a shift register 20 receiving and sending data from and to memory cells on a selected one row in the memory cell array block 10, a data-in buffer 30 responsive to a clock signal $\phi_O$ to be activated for serially transmitting input data to the shift register 20, and a data-out buffer 40 responsive to the clock signal $\phi_O$ to be activated for serially reading out data latched in the shift register 20. The shift register 20 has data latching and shifting functions, which performs a data shifting operation in response to the clock signal $\phi_O$. In addition, the shift register 20 is connected to either one of the data-in buffer 30 and the data-out buffer 40 in response to a control signal (read/write enabling signal) W.

In order to write/read data to/from the memory cell array block 11, there are provided a shift register 21 receiving and sending data from and to memory cells on a selected one row in the memory cell array block 11, a data-in buffer 31 responsive to a clock signal $\phi_1$ to be activated for transferring write data to the shift register 21 in series, and a data-out buffer 41 responsive to the clock signal $\phi_1$ to be activated for serially reading out data latched in the shift register 21. The shift register 21 has data latching and shifting functions, timings for data shifting operation thereof being provided by the clock signal $\phi_1$. In addition, the shift register 21 is connected to either one of the data-in buffer 31 and the data-out buffer 41 in response to the control signal W.

In order to select respective one rows in the memory cell array blocks 10 and 11, there are provided a timing generator 60 responsive to a control signal $\overline{RAS}$ externally applied for generating an operation timing signal, an address counter 61 responsive to a timing signal from the timing generator 60 for incrementing or decrementing a count value thereof, an X decoder 62 for decoding information from the address counter 61 to select memory cells on one row in the memory cell array block 10, and an X decoder 63 for decoding address information from the address counter 61 to select memory cells on one row in the memory cell array block 11.

In addition to the above described structure, in order to generate various control signals, there is provided a control signal generator 100 responsive to an external clock signal $\phi$ and a signal SE for enabling a serial access system for generating clock signals $\phi_O$ and $\phi_1$, a control signal W and the like.

In the above described structure, when the serial access system is enabled, the same address information is applied to the memory cell array blocks 10 and 11, so that data is written/read out from/to memory cells connected to one row in the memory as a whole.

FIG. 9 is a diagram showing one example of a more specific structure of the shift register block shown in FIG. 8.

In FIG. 9, the shift register comprises a transfer gate TG comprising transfer transistors Q1 to Qn respectively provided corresponding to bit lines BL1 to BLn in a memory cell array MA, a data latch DT receiving and sending information from and to memory cells MC connected to a selected word line WL in the memory cell array MA through the transfer gate TG, a shift selector SS responsive to a clock signal $\phi_O$ (or $\phi_1$) for shifting a 1-bit "H" level signal to output the same, a select gate SG responsive to a signal from the shift selector SS for sequentially connecting a 1-bit latch portion in the data latch DT to an input/output line I/0, a switching transistor G1 responsive to a write/read enable signal W to be rendered conductive for connecting the data input/output line I/0 to a data-in buffer, a switching transistor G2 responsive to the write/read enable signal W to be rendered conductive for connecting the data input/output line I/0 to a data-out buffer. The select gate SG comprises switching transistors T1, T2, ..., Tn provided correspondingly to latch portions in the data latch DT. Timings for data transfer of the transfer gate TG are provided by a control signal TE.

In the above described structure, data is serially inputted and outputted to and from the data latch DT in response to a clock signal $\phi_O$ (or $\phi_1$). In addition, data transfer between the data latch DT and the memory cell array MA is collectively and simultaneously made to a single word line WL.

FIG. 10 is a diagram showing another example of the structure of the shift register shown in FIG. 8, which comprises a shift register SR responsive to a clock signal CLK ($\phi_O$ or $\phi_1$) for performing a data shifting operation as well as a data latching operation, a transfer gate TG responsive to a control signal TE for connecting the shift register SR to a selected word line in a memory cell array MA, a switching transistor G1 responsive to a write/read enable signal W to be rendered conductive for connecting the shift register SR to a data-in buffer, and a switching transistor G2 responsive to the write/read enable signal W to be rendered conductive for connecting the shift register SR to a data-out buffer. In the structure shown in FIG. 10, at the time of writing data, data is first transferred serially to the shift register SR from the data-in buffer through the shifting transistor G1 in response to the clock signal CLK. The data latched in the shift register SR are then written to memory cells on a selected one row in the memory cell array MA through the respective corresponding transfer gate TG under control of the control signal TE. At the time of data reading, data in the memory cells on a selected one row are collectively transferred to the shift register SR through the transfer gate TG and then, the data are outputted in series from the shift register SR through the switching transistor G2 and the data-out buffer under control of the clock signal CLK.

FIG. 11 is a diagram showing one example of a structure of the shift register SR and the shift selector SS as shown in FIGS. 9 and 10. In FIG. 11, a block having a shifting function comprises the same number of unit latches USR1 to USRn as the number of bit line (memory cells) connected to a word line of one row. Each of the unit registers comprises two inverters I1 and I2 connected in series and a transistor switch Q2 provided between the inverters I1 and I2. Each of an input portion and an output portion of the unit register is provided with a transistor switch Q1 for shifting data. The transistor switch Q1 is responsive to a clock signal CLK to be rendered conductive for performing a data shifting operation. The transistor switch Q2 in the unit register is responsive to a clock signal $\overline{CLK}$ to be rendered conductive for performing a data latching operation.

Internal clock signals $\phi_O$ and $\phi_1$ are applied by frequency-dividing a clock signal $\phi$ externally applied or by a gating processing thereon.

FIG. 12 is a waveform diagram of signals showing a data reading operation of a memory serially accessible shown in FIG. 8. Referring now to FIGS. 8 and 12, the data reading operation will be described.

First, when the externally applied signal SE for activating the serial access system enters an active state (attains "H" level in FIG. 12), the internal clock signals $\phi_O$ and $\phi_1$ and the read enable signal W are issued from the control signal generator 100. At the time of data reading, the write/read enabling signal W is set to an "L" level indicating a reading operation. The internal clocks $\phi_O$ and $\phi_1$ are applied by frequency-dividing the clock signal $\phi$ externally applied. The clock signal $\phi_O$ is generated in synchronization with clock pulses in odd numbers of the external clock signal $\phi$, and the internal clock signal $\phi_1$ is generated in synchronization with clock pulses in even numbers of the external clock signal $\phi$. On this occasion, the shift registers 20 and 21 are connected to the data-out buffers 40 and 41 in response to the write/read enabling signal W, respectively. After data in the memory cells connected to the respective selected word lines in the memory cell array blocks 10 and 11 are respectively transferred to the shift register 20 and 21, the data latched in the shift register 20 is read out through the data-out buffer 40 in response to the clock signal $\phi_O$ while the data latched in the shift register 21 is read out through the data-out buffer 41 in response to the clock signal $\phi_1$. Since the respective shifting operations in the shift registers 20 and 21 are alternately performed and the data-out buffers 40 and 41 are alternately activated, the data read out from the memory cell array blocks 10 and 11 are alternately and sequentially read out in series from the data-out buffers 40 and 41. Consequently, data can be read out in response to a high-speed external clock signal $\phi$ with internal circuitry operating at half a frequency of the external clock signal $\phi$.

In the above described structure, an X address for selecting memory cells on one row from each of the memory cell array blocks 10 and 11 is generated from the address counter 61 in response to the timing signal from the timing generator 60 which is activated in response to the signal $\overline{RAS}$. Address information from the address counter 61 is applied to the X decoders 62 and 63, so that memory cells on one row are selected from each of the memory cell array blocks 10 and 11. Respective data transfers between the memory cell array blocks 10 and 11 and the shift registers 20 and 21 are made through the transfer gate TG as previously described with reference to FIGS. 9 and 10. The control signal TE is responsive to the timing signal from the timing generator 60 and the enabling signal SE for a serial access system to be generated after the word line is selected (the details of this structure are not shown).

FIG. 13 is a waveform diagram showing a data writing operation of the serial access memory shown in FIG. 8. Referring now to FIGS. 8 and 13, the data writing operation will be described. First, the serial access operation is performed in response to the rise to the "H" level of the control signal SE externally applied. In response thereto, the "H" level write enabling signal W is generated from the control signal generator 100, to be applied to the shift registers 20 and 21. Consequently, the shift register 20 and 21 are connected to the data-in buffers 30 and 31, respectively. Then, data are serially transferred to the shift registers 20 and 21 through the data-in buffers 30 and 31 in response to the internal clock signals $\phi_1$ and $\phi_O$ produced by frequency-dividing the external clock $\phi$. More specifically, the data-in buffer 30 first serially transfers data in odd numbers in a data stream to the shift register 20 in response to the clock signal $\phi_O$, and the data-in buffer 31 transfers data in even numbers in a data stream to the shift register 21 in response to the clock signal $\phi_1$. After the data are transferred to the shift registers 20 and 21, the data latched in the shift registers 20 and 21 are transferred into memory cells connected to the respective selected word lines in the memory cell array blocks 10 and 11, so that a data writing operation is performed.

As described in the foregoing, in the serial access operation, a word line has been selected in the memory cell array simultaneously or in parallel with data transfer to the shift registers at the time of data writing. Data are written to the memory cells connected to the selected word line after the operation of transferring data to the shift registers is completed. In addition, at the time of data reading, data from the selected word line can be collectively transferred at a time to the shift registers, to be serially output from the shift registers and the next word line is selected simultaneously with data output to prepare for the next data reading operation. Therefore, a data writing/reading operation can be performed at higher speed, as compared with the conventional bit-by-bit operation or page mode operation. The page mode is an operation mode where while the signal $\overline{RAS}$ is maintained at "L" level, the signal $\overline{CAS}$ is toggled to accept a column address to select a column out of the memory cell array each toggle of the signal $\overline{CAS}$. That is, one page data selected by a row address is selected sequentially by a column address strobed at each toggling of the signal $\overline{CAS}$. However, in the above described structure, internal clock signals respectively applied to a portion associated with the memory cell array block 10, the shift register 20, the data-in buffer 30 and the data-out buffer 40 and to a portion associated with the memory cell array block 11, the shift register 21, the data-in buffer 31 and the data-out buffer 41 are different from each other by one cycle of the high-speed external clock signal $\phi$. Thus, if and when the memory cell array is divided into the blocks and each of the blocks is operated in a time-divisional manner, as described above, respective circuitry related to the blocks must be operated at different operation timings corresponding to the respective internal clock signals. However, in this case, the operation timings for the blocks differ from each other by one cycle of the external clock. Since the external clock is fast, i.e. $4f_{sc}$ or $8f_{sc}$ as described above, the design of the operation timings for the entire memory becomes substantially difficult. In addition to the difficulty of the timing design (design of timings for each circuitry), a problem is caused when each of the shift register blocks is operated in a time-divisional manner using the above described internal clock signals having different phases, the following problem occurs: operations of a latching transistors and a transferring transistors included in a shift register block must be controlled by the same clock signal. However, if and when the number of bit lines (memory cells) connected to a single word line is increased, the number of switching transistors (latching transistors and transferring transistors) is responsively increased. Similarly, the number and the length of signal lines for transmitting the clock signals thereto are increased, so that delay in signal transmission due to a long interconnection occurs. In order to avoid this delay and operate a lot of latching transistors and transferring transistors in synchronization with each other using the same clock signal, the driving capability of a clock signal generating circuit must be increased, so that the size of the clock signal generating circuit is increased, which causes a large difficulty against high integration density. Furthermore, if the shift register comprising a lot of register portions is operated in response to a clock signal, an interconnection becomes long, so that the layout of the interconnection becomes complicated, which causes a difficulty on the circuit design.

As an example, considered is a serial access memory in which one row of the memory cell array is provided with 1024 memory cells. In this memory, each shift register should have 1024 stages of unit registers. Thus, a clock signal line for transferring a clock for driving the shift register becomes long to provide a large capacitance, resulting in a clock transferring delay. In such circumstances, if non-overlapping clocks are employed for driving the two separate shift registers, some unit registers in respective shift registers operates in an overlapping manner to provide erroneous data transfer. In addition, two separate clock signal lines should be provided for the two separate shift registers to require a large area for the interconnection of the clock lines between the shift registers and the shift register drivers. Further, in the conventional device, two shift register drivers are provided for driving the shift registers to occupy a large area in a device chip. Still further, two long clock lines are provided in the regions near to each other to cause interference of the shift clocks between the two clock lines, so that the shift registers cannot operate at a sufficiently correct timing for the memory blocks to operate in a time-divisional manner.

Thus, if and when the memory cell array must be divided into a plurality of blocks and the internal circuits must be independently operated in a time-divisional manner corresponding to the blocks, the blocks are independently operated in a time-divisional manner by the internal clock signals, so that problems such as the difficulty in the above described timing design occur.

SUMMARY OF THE INVENTION

One object of the invention is to provide improvements to timing of serial access among multiple memory array blocks.

Another object of the invention is to improve the operating speed of serial data access with respect to the memory array blocks of a multiple block memory array system.

Another object of the invention is to simplify timing among serial shift registers connected respectively to the blocks of a multiple memory array system.

A further object of the invention is to simplify timing interconnections to shift registers connected to the memory array blocks of a multiple block memory array system.

A still further object is to provide improvements to a video display memory system incorporating VRAMs.

Another object of the invention is to provide faster serial data access within a multiple memory array block video memory system.

A further object is to simplify interconnection wiring to the serial shift registers of a VRAM system.

A still further object of the invention is to reduce the amount of noise interference as a result of capacitive coupling between shift register clock lines and to ground in a serial access, multiple block memory system.

Another object is to reduce the amount of input capacitance to the timing lines of serial shift registers within a serial access, multiple block memory array system.

Still another object of the invention is to reduce the interconnection area associated with a serial access, multiple memory block array system.

The serial access memory according to the present invention includes means for generating an internal clock signal having a lower frequency than that of an external clock signal in response to the external clock signal and a write/read enabling signal and applying the same shift registers provided corresponding to memory cell array blocks, so that shift registers each provided corresponding to each of the memory cell array blocks are operated to be synchronized with each other using an identical internal clock signal.

In the serial access memory according to the present invention, since operations of the shift registers for receiving and sending data from and to the memory cell array blocks and for performing serial inputting and outputting data are controlled by an identical internal clock signal, operation timings of the device need not be varied every memory cell array block depending on operation timings of the shift registers so that internal timings of the device can be easily designed.

These objects and other objects, features, aspects and advantages of the present invention will become more apparent from the following detailed description of the present invention when taken in conjunction with the accompanying drawings.

DESCRIPTION OF THE PREFERRED EMBODIMENT

In general, VRAM is known as a serial access memory and includes a DRAM and a shift register for communicating data to and from the DRAM.

Figure 1:
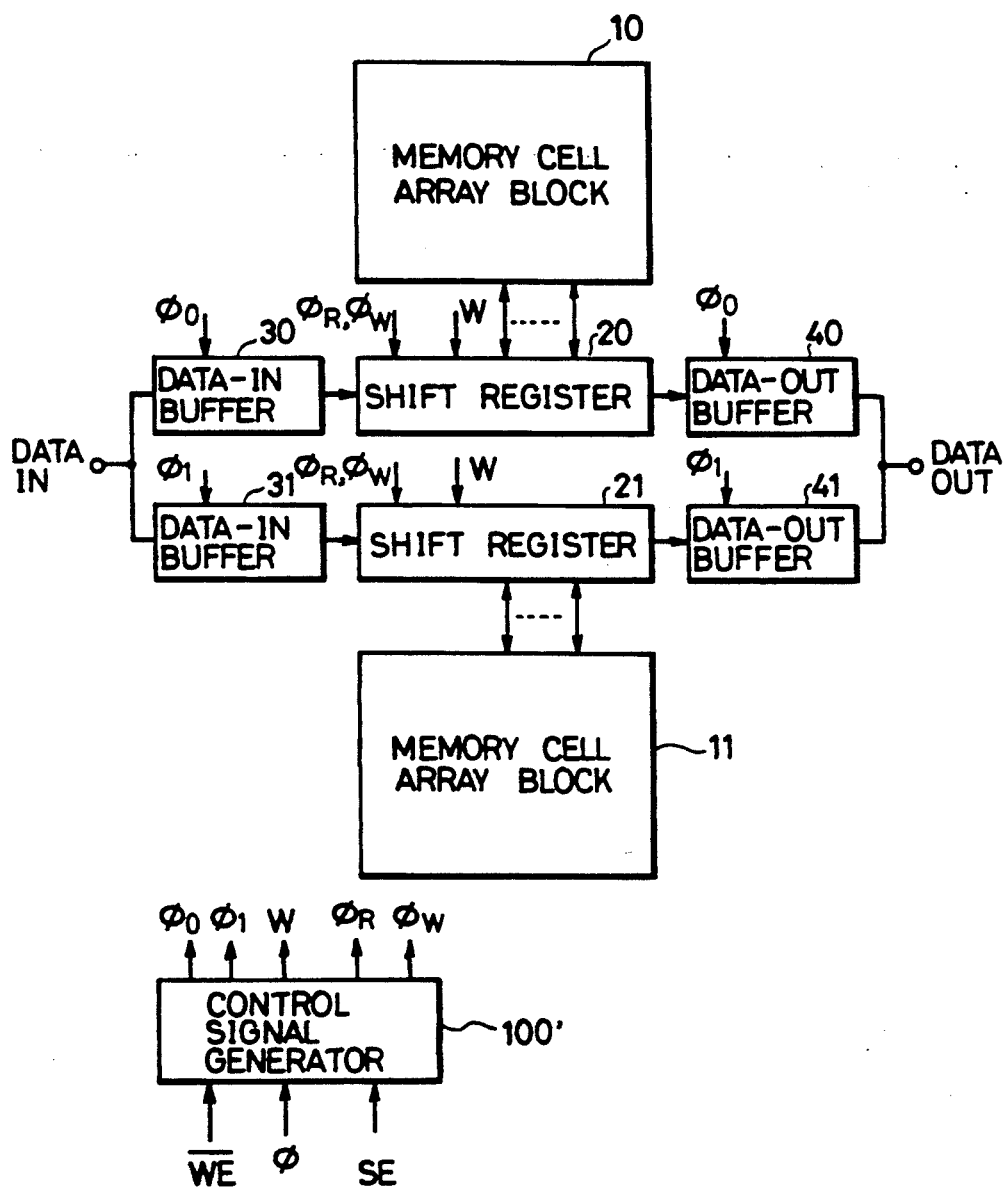
FIG. 1 is a diagram showing schematically a structure of a serial access portion in a serial access memory according to one embodiment of the present invention.
Figure 8:
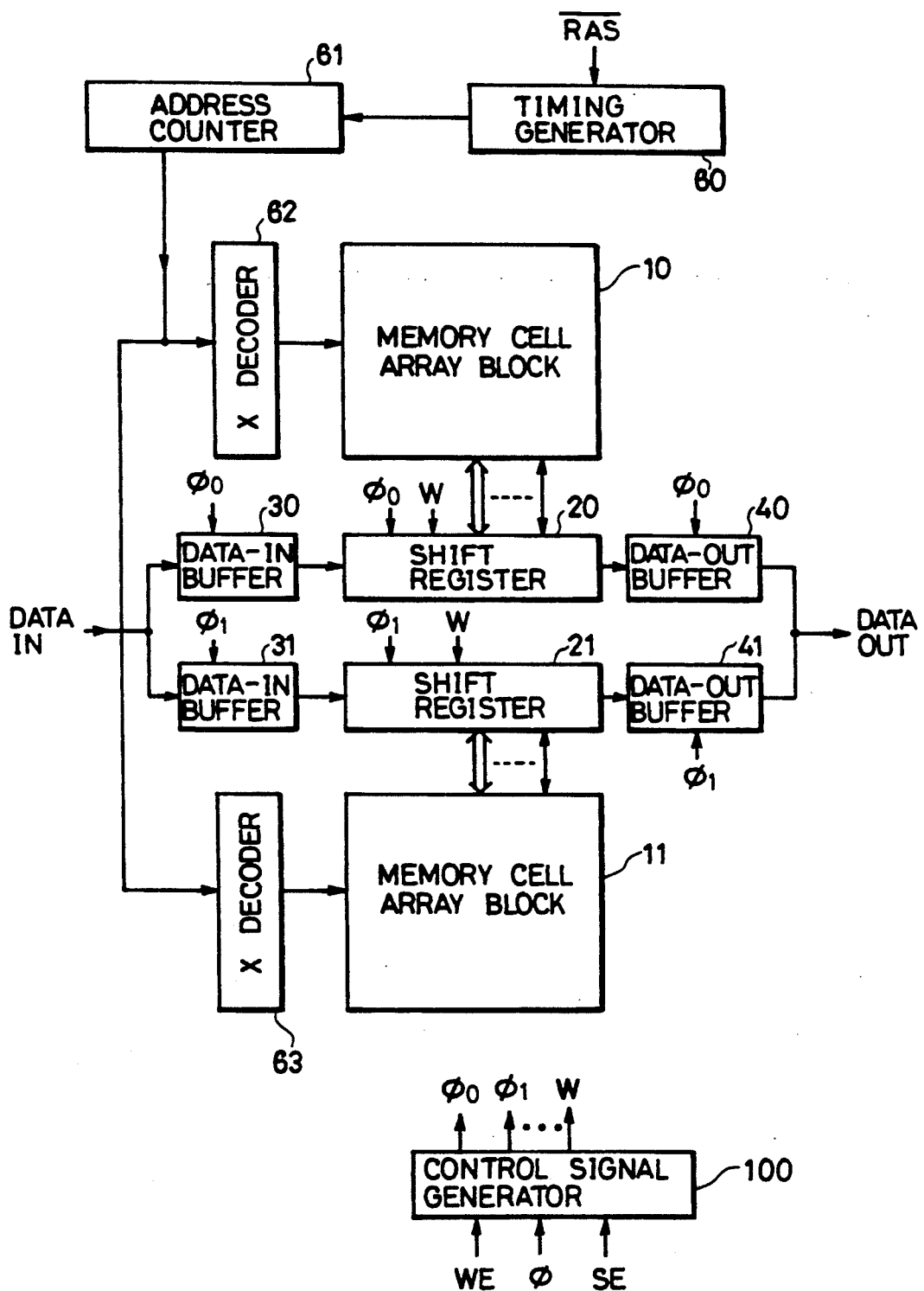
FIG. 8 is a diagram showing schematically the entire structure of the serial access system in a conventional serial access memory.

FIG. 1 is a diagram showing schematically the entire structure of a serial access portion in a serial access memory according to one embodiment of the present invention. In FIG. 1, components corresponding to those shown in FIG. 8 have the same reference numerals.

In FIG. 1, shift registers 20 and 21 respectively provided corresponding to memory cell array blocks 10 and 11 perform a shifting operation in response to the same internal clock signals $\phi_R$ and $\phi_w$. The internal clock signal $\phi_R$ is generated at the time of data reading while the internal clock signal $\phi_w$ is generated at the time of data writing. The internal clock signals $\phi_R$ and $\phi_w$ are generated from a control signal generator 100, for generating various control signals in response to a write enabling signal $\overline{WE}$, an external clock signal $\phi$ and an enable signal SE for a serial access portion which are all externally applied. Operations of a data-in buffer 30 for serially inputting data such as video signal data and transferring the same to the shift register 20 and a data-out buffer 40 serially receiving the data from the shift register 20 to output the same are controlled by an internal clock signal $\phi_O$, as in the conventional example. Similarly, operations of a data-in buffer 31 serially receiving data externally applied for transferring the same to the shift register and a data-out buffer 41 serially receiving the data from the shift register 21 to output the same are controlled by an internal clock signal $\phi_1$. The internal clock signals $\phi_O$ and $\phi_1$ are the same as the internal clock signals shown in FIG. 8.

Figure 2:
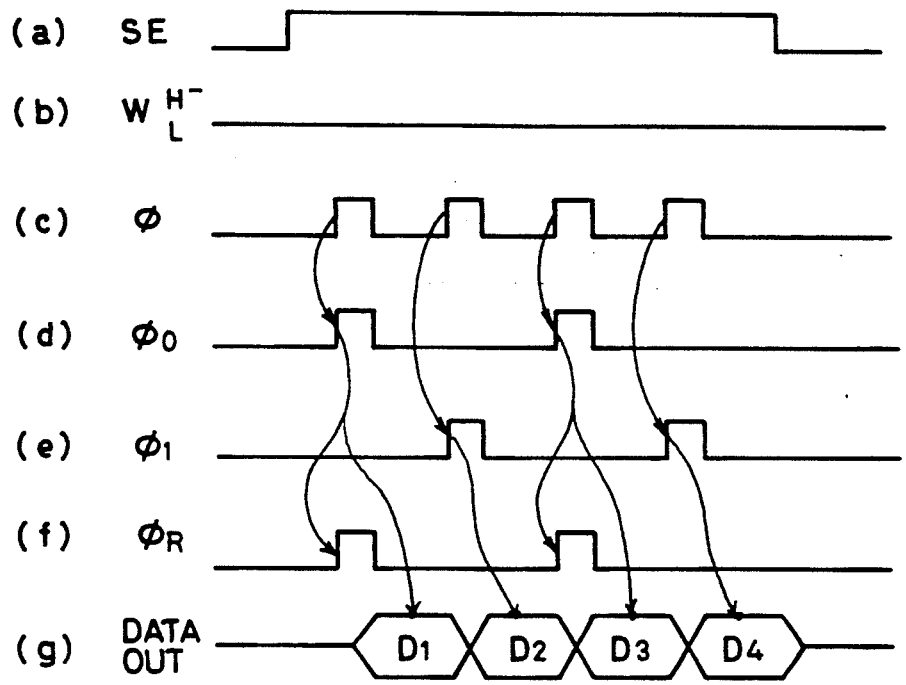
FIG. 2 is a waveform diagram of signals showing operation timings of the serial access memory according to one embodiment of the present invention at the time of data reading.

FIG. 2 is a waveform diagram showing a data reading operation of the serial access memory according to one embodiment of the present invention shown in FIG. 1. Referring now to FIGS. 1 and 2, description is made on the data reading operation of the serial access memory according to one embodiment of the present invention. First, when serial access is made to the device, the enable signal SE for a serial access portion is raised to an "H" level of an active state, so that the serial access portion is activated. At the time of data reading, the write enabling signal $\overline{WE}$ rises to an "H" level indicating data reading, so that the write/read enabling signal W attains the "L" level. When the external clock signal $\phi$ is applied, the internal clock signal $\phi_O$ is generated in synchronization with external clock pulses in odd numbers of the external clock signal series, to be applied to the data-in buffer 30 and the data-out buffer 40, in the same manner as described above. On the other hand, the internal clock signal $\phi_1$ is generated in response to clock pulses in even numbers of the external clock signal series $\phi$, to be applied to the data-in buffer 31 and the data-out buffer 41. Similarly, at the time of data reading, a clock signal $\phi_R$ for data reading is generated in synchronization with clock pulses in odd numbers of the external clock signal series $\phi$ in response to the write enabling signal $\overline{WE}$ (or control signal W) and the external clock signal $\phi$. Consequently, data in memory cells on the respective selected one rows in the memory cell array blocks 10 and 11 (the data in the memory cells on respective one rows have been already applied to the shift registers 20 and 21, respectively, before the clock signal $\phi_R$ is applied) are applied to the data-out buffers 40 and 41 in response to the internal clock signal $\phi_R$. Since the data-out buffers 40 and 41 are activated in response to the internal clock signals $\phi_O$ and $\phi_1$, respectively, data in odd numbers in a data stream are supplied to the data-out buffer 40 to be outputted while data in even numbers in the data stream are supplied to the data-out buffer 41 to be outputted. As the result, continuous data stream as a whole are serially read out from the data-out buffers 40 and 41.

On this occasion, since the operations of the shift registers 20 and 21 are controlled by the same reading internal clock signals $\phi_R$, timings of activation of transfer gates therein can be set the same for every block, so that the timing design of internal circuitry of the memory device can be easily made.

Figure 3:
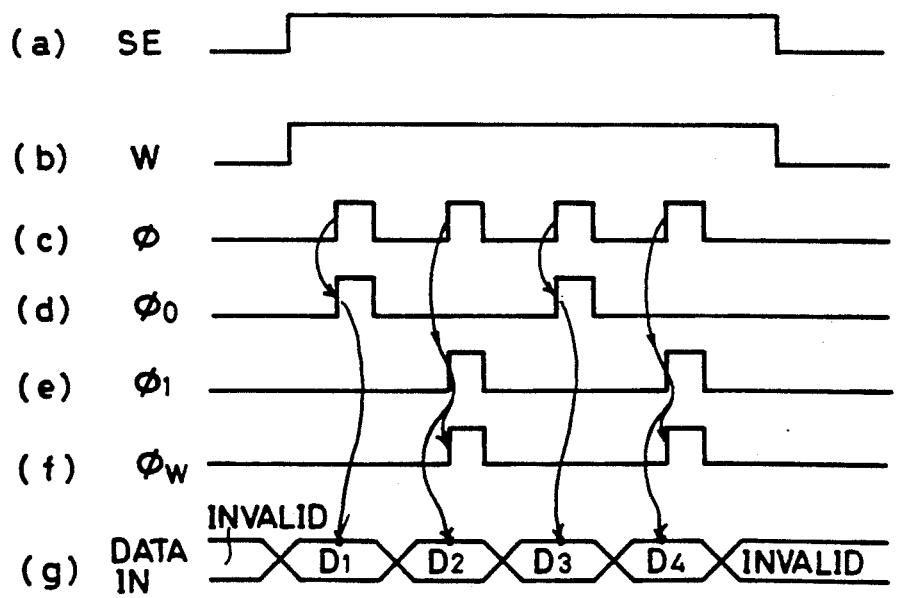
FIG. 3 is a waveform diagram of signals showing operation timings of the serial access memory according to one embodiment of the present invention at the time of data writing.

FIG. 3 is a waveform diagram of signals showing a data writing operation of the serial access memory according to one embodiment of the present invention. Referring now to FIG. 1 and 3, description is made on the data writing operation of the serial access memory according to one embodiment of the present invention.

First, at the time of the data writing operation, the enable signal SE for a serial access system is raised to the "H" level. Consequently, a serial access mode operation can be performed. Then, the internal write enabling signal W is raised to the "H" level of an active state indicating the writing operation in response to "L" level of the write/read enabling signal $\overline{WE}$ externally applied. Consequently, the shift registers 20 and 21 are connected to the data-in buffers 30 and 31, respectively. Then, when the external clock $\phi$ is applied, the internal clock signal $\phi_O$ is generated in synchronization with clock pulses in odd numbers of the external clock signal series while the internal clock signal $\phi_1$ is generated in synchronization with clock pulses in odd numbers of the external clock signal series. The internal clock signals $\phi_O$ and $\phi_1$ are applied to the data-in buffers 30 and 31, respectively. When the first odd and even data are applied to the data-in buffers 30 and 31, respectively, to be accepted therein, the internal clock signal $\phi_w$ for writing is generated in response to the external clock signal $\phi$ and the write/read enabling signal $\overline{WE}$ (or the internal write enabling signal W) externally applied. The internal clock signal $\phi_w$ is generated in synchronization with clock pulses in odd numbers of the external clock signal series $\phi$. Consequently, data accepted in the data-in buffers 30 and 31, respectively, can be then, applied to the shift registers 20 and 21 in series, respectively. Therefore, data in odd numbers in a data stream are sequentially and serially transferred into the shift register 20 while data in even numbers are sequentially transferred into the shift register 21. After data corresponding to one row are transferred to the respective shift registers 20 and 21 to be latched therein, data latched in the shift registers 20 and 21 through the transfer gate (see FIG. 9) are written simultaneously and in parallel to memory cells on the respective selected one rows in the memory cell array blocks 10 and 11. Consequently, the writing operation is completed.

Figure 4:
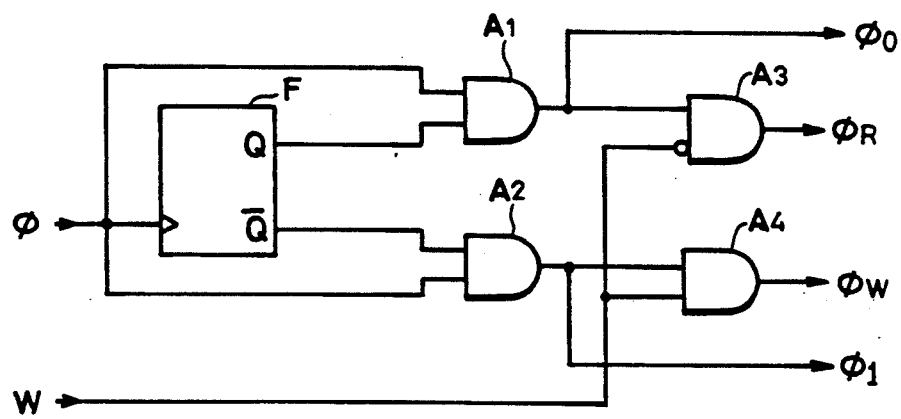
FIG. 4 is a diagram showing one example of a circuit structure for generating internal clock signals used in the serial access memory according to the present invention.

FIG. 4 is a diagram showing one example of a circuit structure for generating internal clock signals. In FIG. 4, an internal clock generating circuit is divided into a reading internal clock $\phi_R$ generating system and a writing internal clock $\phi_w$ generating system.

A circuitry involved in generating a reading internal clock signal $\phi_R$ comprises a flip-flop F output data of which is inverted every rising of the clock signal $\phi$ externally applied, an AND gate A1 receiving the external clock signal $\phi$ and a Q output of the flip-flop F, and an AND gate A3 receiving an output of the AND gate A1 and the internal write enabling signal W. An internal clock signal $\phi_O$ is generated from the AND gate A1, and the signal $\phi_R$ is outputted from the AND gate A3.

A circuitry involved in generating a writing internal clock signal $\phi_w$ comprises an AND gate A2 receiving a $\overline{Q}$ output of the flip-flop F and the external clock signal $\phi$, and an AND gate A4 receiving an output of the AND gate A2 and the write enabling signal W. An internal clock signal $\phi_1$ is generated from the AND gate A2, and the writing internal clock signal $\phi_w$ is applied from the AND gate A4. The gates A3 and A4 in FIG. 4 selectively apply one of the clock signals to the clock input line $\Phi_R$, $\Phi_W$ of each of the registers 20 and 21 in FIG. 1 in response to the write enabling signal W.

According to the structure shown in FIG. 4, a shifting clock can be obtained which has different relations in phase to the external clock signal at the time of data writing and at the time of data reading and which is synchronized with the external clock signal. The structure shown in FIG. 4 is employed by way of example and thus, another structure can be employed.

Figure 9:
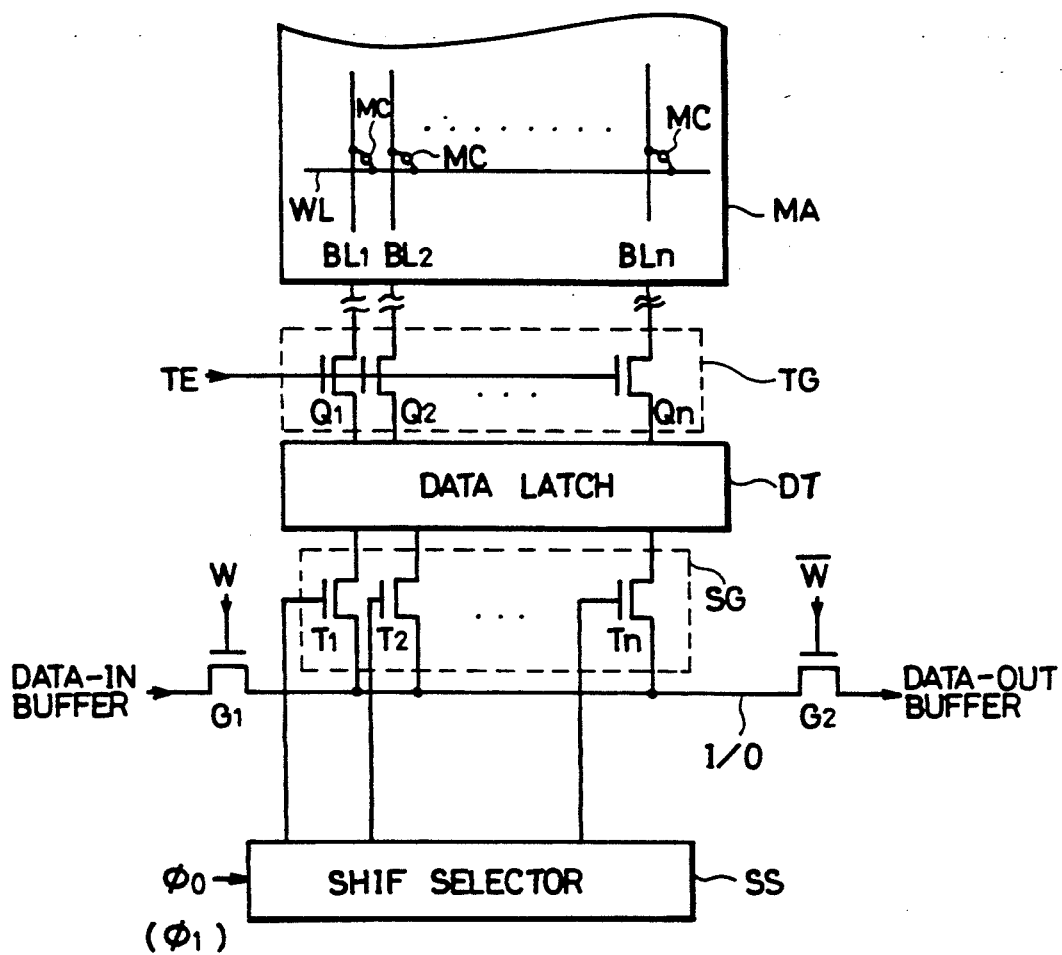
FIG. 9 is a diagram showing more specifically a structure of a shift register- portion in the conventional serial access memory.
Figure 10:
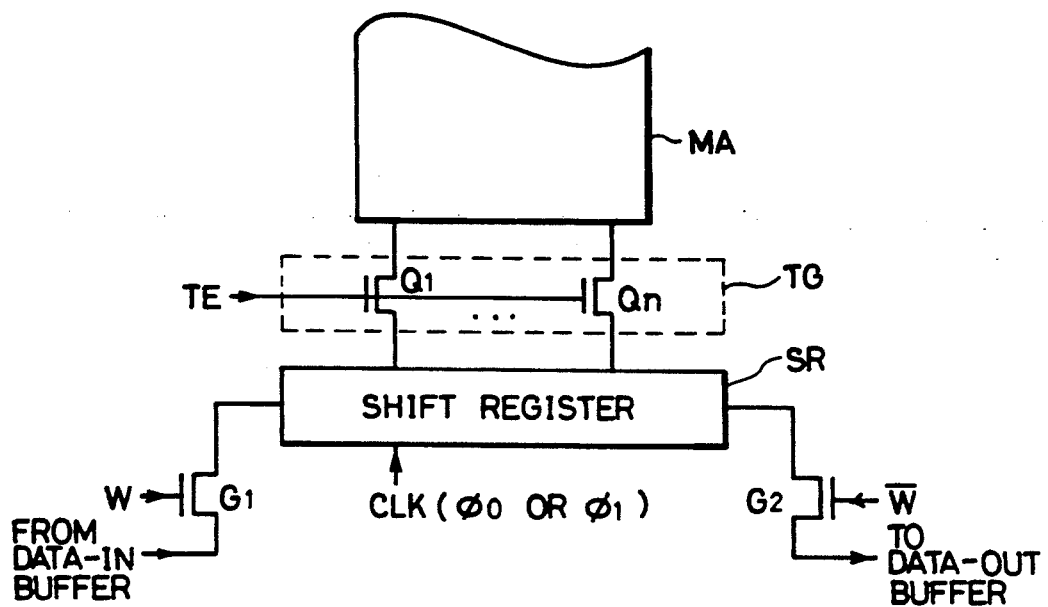
FIG. 10 is a diagram showing specifically another structure of a shift register portion in the conventional serial access memory.
Figure 11:
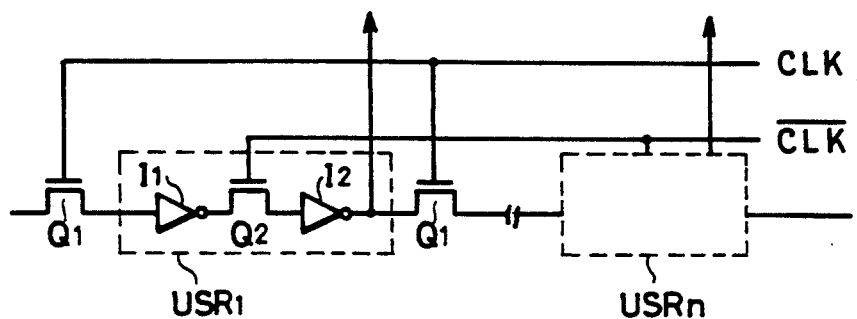
FIG. 11 is a diagram showing one example of a structure of a shift selector and a shift register shown in FIGS. 9 and 11.
Figure 12:
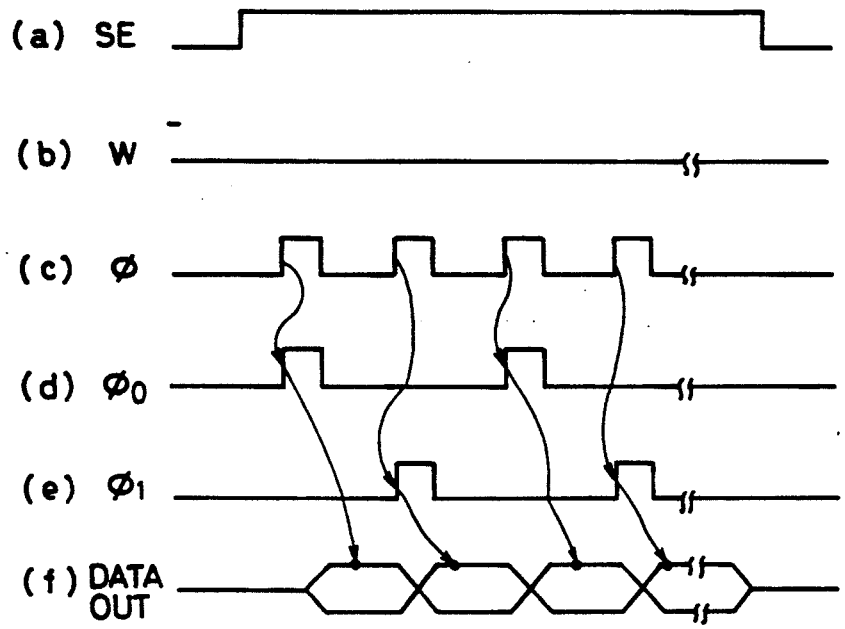
FIG. 12 is a waveform diagram showing operation timings of the conventional serial access memory at the time of data reading.
Figure 13:
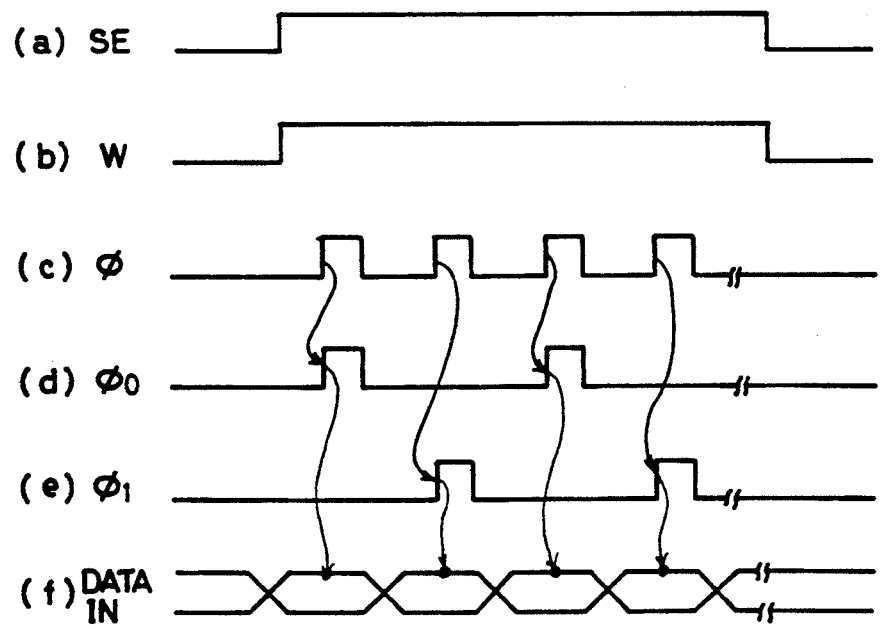
FIG. 13 is a waveform diagram of signals showing operation timings of the conventional serial access memory at the time of data writing.

Although the above described structure shows a case in which the shift register shown in, for example, FIGS. 9 and 10 is provided every memory cell array block, the structure can be replaced with another structure.

Figure 5:
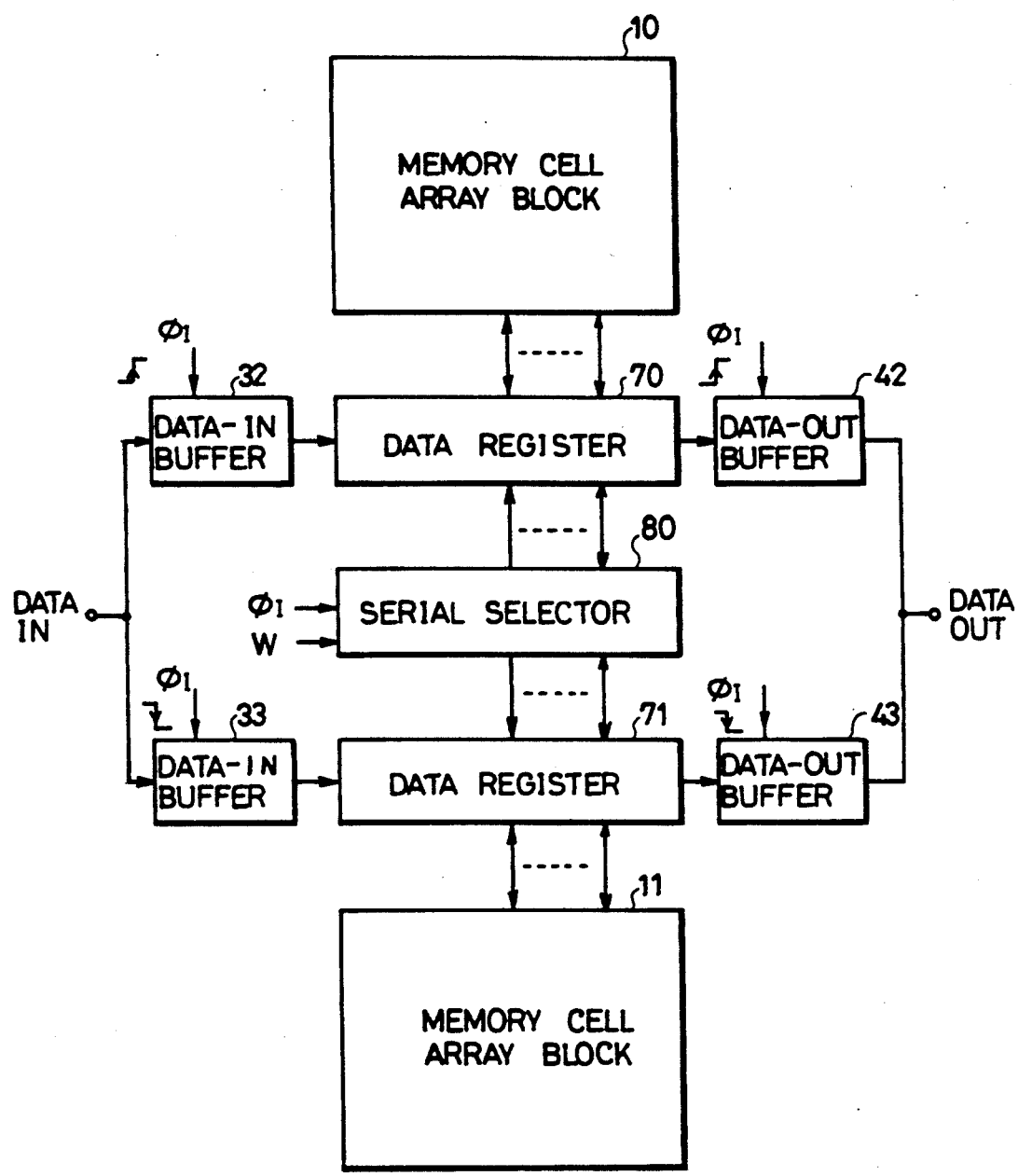
FIG. 5 is a diagram showing schematically the entire structure of a serial access memory according to another embodiment of invention.

FIG. 5 is a diagram showing schematically a structure of a serial access memory according to another embodiment of the present invention. In FIG. 5, a structure is shown in which operations are controlled using only the same internal clock signal $\phi_I$.

In FIG. 5, there are provided a data register 70 for receiving and sending data from and to memory cells on a selected one row in a memory cell array block 10, a data register 71 for receiving and sending data from and to memory cells on a selected one row in the memory cell array block 11, and a serial selector 80 for controlling data writing and reading operations of the data registers 70 and 71. Serial data from a data-in buffer 32 is transferred to a data register portion selected by the serial selector 80. Similarly, serial data from a data-in buffer 33 is written to a register portion in the data register 71 selected by a control signal from the serial selector 80. In addition, data in memory cells on one row latched in the data register 70 are sequentially outputted through a data-out buffer 42 under control of the serial selector 80. Data latched in the data register 71 are serially outputted through a data-out buffer 43 under control of the serial selector 80.

In the structure shown in FIG. 5, the data registers 70 and 71 each correspond to the structure including the transfer gate TG, the data latch DT and the select gate SG shown in FIG. 9. The serial selector 80 corresponds to the structure including the shift selector SS and the switching transistors G1 and G2 shown in FIG. 9. A shift clock in the serial selector 80 will be described below.

The data-in buffer 32 and the data-out buffer 42 are both activated in response to the rise of the internal clock signal $\phi_I$ for performing data accepting and transferring operations. The data-in buffer 33 and the data-out buffer 43 are activated in response to the fall of the internal clock signals $\phi_I$ for performing data accepting and transferring operations.

Figure 6:
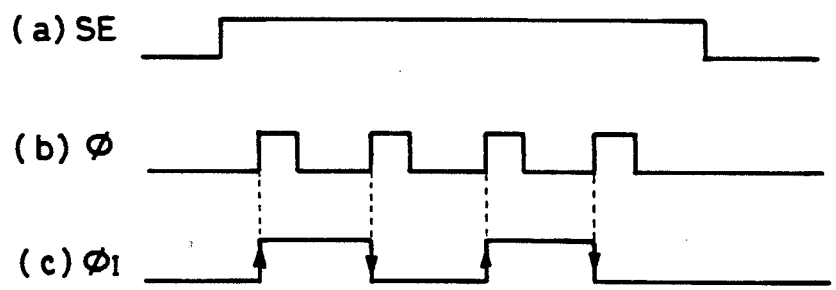
FIG. 6 diagram showing timings of internal clock signals in of the present invention.

The internal signal $\phi_I$ is formed by frequency-dividing the external clock signal $\phi$, as shown in FIG. 6. More specifically, the internal clock signal $\phi_I$ has a doubled cycle period of the external clock signal $\phi$. In the above described structure, the serial selector 80 connects the data-in buffers 32 and 33 to the data registers 70 and 71, respectively, under an active state of the write enabling signal W, to write data from the data-in buffers 32 and 33 to the data registers 70 and 71 in response to the clock signal $\phi_I$, respectively. On this occasion, since the data-in buffers 32 and 33 are responsive to the rise and the fall of the internal clock signal $\phi_I$ to the activated, respectively, for performing data accepting and transferring operations, data is first written to the data register 70 through the data-in buffer 32 and then, data from the data-in buffer 33 is written to the data register 71. Thus, input data can be alternately written to the data registers 70 and 71 using the same internal clock signal $\phi_I$. At the time of reading out data, the serial selector 80 connects the data registers 70 and 71 to the data-out buffers 42 and 43, respectively, in response to an inactive state of the external write enabling signal $\overline{WE}$ (or internal write enabling signal W). The respective data registers 70 and 71 serially perform a transferring operation bit by bit under control of the serial selector 80, to output data to the data-out buffers 42 and 43. The data-out buffers 42 and 43 are activated in synchronization with the rise and the fall of the internal clock signal $\phi_I$, respectively, for performing data accepting and transferring operations. Thus, data from the data registers 70 and 71 are alternately outputted from the data-out buffers 42 and 43, so that non-interrupted and continuous data stream provided.

Although in the above described embodiment, the data-in buffer 33 and the data-out buffer 43 are activated in response to the fall of the internal clock signal $\phi_I$, the data-in buffer 33 and the data-out buffer 43 may be activated using an inverted signal of the internal clock signal $\phi_I$, to obtain the same effect as that of the above described embodiment. On this occasion, the respective timing of the shift clock in the serial selector at the time of data writing and at the time of data reading must be made different from each other.

Figure 7A:
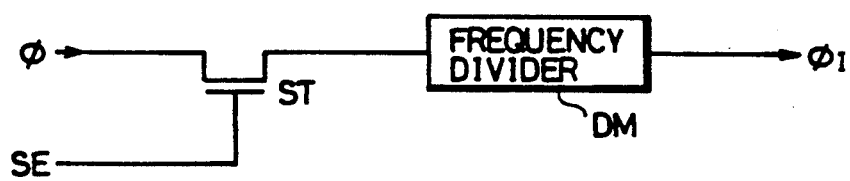
FIG. 7A is a diagram showing one example of a circuit structures for generating the internal clock signals used in another embodiment of the present invention.
Figure 7B:
FIG. 7B is a diagram showing one example of a circuit structure for generating a control signal for providing timings for a shifting operation of a serial selector used in another embodiment of the present invention.

FIG. 7 A is a diagram showing one example of a circuit structure for forming the internal clock signal $\phi_I$ shown in FIGS. 5 and 6. The internal clock signal $\phi_I$ is generated by a switching transistor ST passing an external clock signal $\phi$ responsive to a serial access enable signal SE and a frequency divider DM receiving the clock from the switching transistor ST for frequency-dividing the received clock into a frequency of one-half of the external clock with the duty ratio of 50. An internal clock signal $\phi_I'$ providing timings for a shifting operation of the serial selector 80 is generated by an ExOR circuit E receiving an internal clock signal $\phi_I$ and a write enabling signal W. According to the structure shown in FIG. 7B, an internal control signal $\phi_I'$ providing timings for a shifting operation can be obtained which rises in synchronization with the first rise of the external clock signal $\phi$ at the time of data reading while it rises, synchronously with the external clock $\phi$ after data writing to both the data-in buffers 30 and 31 is completed, i.e., after the internal clock signal $\phi_I$ first rises and subsequently falls.

In the above described embodiment, description was made on a structure in which serial data transfer is made at a frequency of one-half of that of the external clock signal $\phi$, it should be noted that the present invention is not limited to the same. For example, the present invention may be applied to a structure in which serial data transfer is made once every three cycles of the external clock signal $\phi$ the serial data transfer is made at a lower speed, to obtain the same effect as that of the present invention.

As described in the foregoing, according to the present invention, data transfer in a shift register provided for each of a plurality of blocks in a memory cell array is made using the same single internal clock signal and respective operation timings of a shift register at the time of data writing and at the time of data reading are made different from each other. Thus, serial data transfer can be ensured to be reliably made at a lower speed than that defined by an external clock signal, an operation of internal circuitry can be respectively performed at a low speed, and transferring operations of the shift registers are performed using the same single clock signal, so that the internal timing design in a serial access memory can be easily made.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A serial access semiconductor memory device, comprising:
   a memory cell array divided into a plurality of blocks,
   a plurality of register means each provided corresponding to each said plurality of blocks for receiving and sending data from and to memory cells on a selected row in the corresponding block, each of said plurality of register means including means for data latching and shifting data,
   a plurality of input buffer means each provided separately corresponding to each said plurality of register means for serially transmitting externally applied data to the corresponding register, said plurality of input buffer means receiving different data from each other in a sequential data stream,
   a plurality of output buffer means each provided corresponding to each of said plurality of register means for serially outputting the data received from the corresponding register means, wherein timing of the activation of the input buffer means and the output buffer means for each of the memory cell array blocks is different,
   means for providing an external clock signal and a write/read enabling signal; and
   logic means responsive to said external clock signal and said write/read enabling signal for generating an internal clock signal;
   wherein said internal clock signal is applied in common to said plurality of register means, so that a shifting operation in each of said plurality of register means is performed in response to the same internal clock signal, and the relationship of operation timing between said plurality of register means and said plurality of input buffer means during a data writing operation differs from the relationship of operation timing between said plurality of register means and said plurality of output buffer means during a data reading operation.

2. A device in accordance with claim 1, wherein said internal clock signal generating means include means for providing a write clock signal having a first activating timing for the data write operation and providing a read clock signal having a second activating timing, different from said first activating timing, for the data reading operation.

3. A device in accordance with claim 1, wherein said internal clock signal generating means include means for providing a clock signal as said internal clock signal in synchronization with operation of a first activated output buffer means among said plurality of output buffer means in the data reading operation.

4. A device in accordance with claim 1, wherein said internal clock generating means include means for providing a clock signal as said internal clock signal in synchronization with operation of one input buffer means among said plurality of input means in the data writing operation.

5. A serial access memory device, comprising:
   a first memory cell array having a plurality of memory cells,
   a first shift register for latching and shifting a series of read-out data in reading out the series of read-out data from a series of memory cells of said first memory cell array and for latching and shifting a series of written-in data in writing the series of written-in data into a series of memory cells of said first memory cell array;
   a first output buffer connected to an output node of said first shift register for providing the read-out data latched in said first register to an output node of said memory device, based on a first clock signal;
   a first input buffer receiving incoming data for providing selectively data to be written into the series of memory cells of said first memory cell array among said incoming data, based on a second clock signal;
   a second memory cell array having a plurality of memory cells,
   a second shift register for latching and shifting a series of read-out data in reading out the series of read-out data out of a series of memory cells of said second memory cell array and for latching and shifting a series of written-in data in writing the series of written-in data into a series of memory cells of said second memory cell array;
   a second output buffer connected to said second shift register for providing the read-out data latched in said second shift register to said output node of said memory device, based on a third clock signal delayed in the phase to said first clock signal;
   a second input buffer receiving the incoming data for providing selectively among the incoming data the data to be written into a series of memory cells of said second memory cell array to said second shift register, based on a fourth clock signal delayed in the phase to said second clock signal;
   means for generating a first control signal in phase with said first clock signal, for controlling the shifting of data latched in said first and second shift registers in reading out the data of the series of memory cells of said first memory cell array latched in said first shift register and the data of the series of memory cells of said second memory cell array latched in said second shift register; and
   means for generating a second control signal for controlling the respective shiftings of data from said first and second input buffers to said first and second shift registers, said second control signal being in phase with said fourth clock signal;
   wherein the relationship of operation timing between said registers and said input buffers differs from the relationship of operation timing between said registers said output buffers.

6. A method for accessing a serially accessible memory device, said memory device including:
   a memory cell array divided into a plurality of blocks,
   a plurality of register means each provided corresponding to each said plurality of blocks for receiving and sending data from and to memory cells on a selected row in the corresponding block, each of said plurality of register means being capable of data latching and shifting data,
   a plurality of input buffer means each provided separately corresponding to each said plurality of register means for serially transmitting externally applied data to the corresponding register, said plurality of input buffer means receiving different data from each other in a sequential data stream,
   a plurality of output buffers means each provided corresponding to each of said plurality of register means for serially outputting the data received from the corresponding register means, wherein timing of the activation of the input buffer means and the output buffer means for each of the memory cell array blocks is different, said method including the steps of:
   providing an external clock signal and a write/read enabling signal;
   generating an internal clock signal in response to said external clock signal; and
   applying said internal clock signal in common to said plurality of register means, so that a shifting operation in each of said plurality of register means is performed in response to the same internal clock signal, and the relationship of operation timing between said plurality of register means and said plurality of input buffer means during a data writing operation differs from the relationship of operation timing between said plurality of register means and said plurality of output buffer means during a data reading operation.

7. A method according to claim 6,
   wherein said internal clock signal generating step includes providing clock signals different in activating timing for the data write operation and the data reading operation.

8. A method according to claim 6,
   wherein said internal clock signal generating step includes providing a clock signal as said internal clock signal in synchronization with operation of a first activated output buffer means among said plurality of output buffer means in the data reading operation.

9. A method according to claim 6,
   wherein said internal clock generating step includes providing a clock signal as said internal clock signal in synchronization with operation of one input buffer means among said plurality of input means in the data writing operation.

10. A video random access memory device (VRAM) for reading and writing pixel data, comprising:
    a memory cell array divided into a plurality of blocks,
    a plurality of register means each provided corresponding to each said plurality of blocks for receiving and sending data from and to memory cells on a selected row in the corresponding block, each of said plurality of register means including means for data latching and shifting data,
    a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output buffer means for each of the memory cell array blocks is different, means for dividing down a chrominance subcarrier; and means responsive to said divided down chrominance subcarrier and a write/read enabling signal for deriving an internal clock signal;

wherein said internal clock signal is applied in common to said plurality of register means, so that a shifting operation in each of said plurality of register means is performed in responsive to the same internal clock signal, and the relationship of operation timing between said plurality of register means and said plurality of input buffer means during a data writing operation differs from the relationship of operation timing between said plurality of register means and said plurality of output buffer means during a data reading operation.

11. A VRAM in accordance with claim 10, wherein said internal clock signal deriving means include means for providing a write clock signal having a first activating timing for the data writing operation and providing a read clock signal having a second activating timing, different from said first activating timing, for the data reading operation.

12. A VRAM in accordance with claim 10, wherein said internal clock signal deriving means include means for providing a clock signal in synchronization with operation of a first activated output buffer means among said plurality of output buffer means in the data reading operation.

13. A VRAM in accordance with claim 10, wherein said internal clock deriving means include means for providing a clock signal as said internal clock signal in synchronization with operation of one input buffer means among said plurality of input means in the data writing operation.

14. A video random access memory comprising:

a first memory cell array having a plurality of memory cells, a first shift register for latching and shifting a series of read-out data in reading out the series of read-out data from a series of memory cells of said first memory cell array and for latching and shifting a series of written-in data in writing the series of written-in data into a series of memory cells of said first memory cell array;

a first output buffer connected to an output node of said first shift register for providing the read-out data latched in said first register to an output node of said memory device, based on a first clock signal;

a first input buffer receiving incoming data for providing selectively data to be written into the series of memory cells of said first memory cell array among said incoming data, based on a second clock signal;

a second memory cell array having a plurality of memory cells, a second shift register for latching and shifting a series of read-out data in reading out the series of read-out data out of a series of memory cells of said second memory cell array and for latching and shifting a series of written-in data in writing the series of written-in data into a series of memory cells of said second memory cell array;

a second output buffer connected to said second shift register for providing the read-out data latched in said second shift register to said output node of said memory device, based on a third clock signal delayed in the phase to said first clock signal;

a second input buffer receiving the incoming data for providing selectively among the incoming data to be written into a series of memory cells of said second memory cell array to said second shift register, based on a fourth clock signal delayed in the phase to said second clock signal;

means for generating a first control signal in phase with said first clock signal, for controlling the shifting of data latched in said first and second shift registers in reading out the data of the series of memory cells of said first memory cell array latched in said first shift register and the data of the series of memory cells of said second memory cell array latched in said second shift register;

means for generating a second control signal for controlling the respective shiftings of data from said first and second input buffers to said first and second shift registers, said second control signal being in phase with said fourth clock signal; and means for generating said first and second clock signals by dividing means a chrominance subcarrier externally applied;

wherein the relationship of operation timing between said registers and said input buffers differs from the relationship of operation timing between said registers and said output buffers.

15. A method for serially accessing a video random access memory, said random access memory comprising:

a memory cell array divided into a plurality of blocks, a plurality of register means each provided corresponding to each said plurality of blocks for receiving and sending data from and to memory cells on a selected row in the corresponding block, each of said plurality of register means being capable of data latching and shifting data operations, a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output buffer means for each of the memory cell array blocks is different, said method including the steps of:

dividing down a chrominance subcarrier externally applied;

deriving an internal clock signal in response to said divided down chrominance subcarrier and a read/write enabling signal externally applied; and applying said internal clock signal in common to said plurality of register means, so that a shifting operation in each of said plurality of register means is performed in response to the same internal clock signal, and the relationship of operation timing between said plurality of register means and said plurality of input buffer means during a data writing operation differs from the relationship of operation timing between said plurality of register means, and said plurality of output buffer means during a data reading operation;

16. A method in accordance with the claim 15, wherein said step of generating the internal clock signal includes the step of generating clock signals different in activating timing for the data writing operation and for the data reading operation.

17. A serial access semiconductor memory device, comprising:

a memory cell array divided into a plurality of blocks, a plurality of register means each provided corresponding to each said plurality of blocks for receiving and sending data from and to memory cells on a selected row in the corresponding block, each of said plurality of register means including means for data latching and shifting data, a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output means for each of the memory cell array blocks is different, means for providing an external clock signal and a write/read enabling signal; and logic means responsive to said external clock signal and said write/read enabling signal for generating an internal clock signal, wherein said logic means include means for providing a write clock signal having a first activating timing for a data writing operation and providing a read clock signal having a second activating timing, different from said first activating timing, for a data reading operation;

wherein said internal clock signal is applied in common to said plurality of register means, so that a shifting operation in each of said plurality of register means is performed in response to the same internal clock signal.

18. A serial access semiconductor memory device, comprising:

a memory cell array divided into a plurality of blocks, a plurality of register means each provided corresponding to each said plurality of blocks for receiving and sending data from and to memory cells on a selected row in the corresponding block, each of said plurality of register means including means for data latching and shifting data, a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output means for each of the memory cell array blocks is different, means for providing an external clock signal and a write/read enabling signal; and logic means responsive to said external clock signal and said write/read enabling signal for generating an internal clock signal, wherein said logic means include (i) means for providing a clock signal as said internal clock signal in synchronization with operation of a first activated output buffer means among said plurality of output buffer means in a data reading operation, and (ii) means for providing a clock signal as said internal clock signal in syncrhonization with operation of one input buffer means among said plurality of input means in a data writing operation;

wherein said internal clock signal is applied in common to said plurality of register means, so that a shifting operation in each of said plurality of register means is performed in response to the same internal clock signal.

19. A serial access memory device, comprising:

a first memory cell array having a plurality of memory cells, a first shift registers for latching and shifting a series of read-out data in reading out the series of read-out data from a series of memory cells of said first memory cell array and for latching and shifting a series of written-in data in writing the series of written-in data into a series of memory cells of said first memory cell array;

a first output buffer connected to an output node of said first shift register for providing the read-out data latched in said fist register to an output node of said memory device, based on a first clock signal;

a first input buffer receiving incoming data for providing selectively data to be written into the series of memory cells of said first memory cell array among said incoming data, based on a second clock signal;

a second memory cell array having a plurality of memory cells, a second shift register for latching and shifting a series of read-out data in reading out the series of read-out data out of a series of memory cells of said second memory cell array and for latching and shifting a series of written-in data in writing the series of written-in data into a series of memory cells of said second memory cell array;

a second output buffer connected to said second shift register for providing the read-out data latched in said second shift register to said output node of said memory device, based on a third clock signal delayed in the phase to said first clock signal;

a second input buffer receiving the incoming data for providing selectively among the incoming data the data to be written to a series of memory cells of said second memory cell array to said second shift register, based on a fourth clock signal delayed in the phase to said second clock signal;

means for generating a first control signal in phase with said first clock signal, for controlling the shifting of data latched in said first and second shift registers in reading out the data of the series of memory cells of said first memory cell array latched in said first shift register and the data of the series of memory cells of said second memory cell array latched in said second shift register; and means for generating a second control signal for controlling the respective shiftings of data from said first and second input buffers to said first and second shift registers, said second control signal being in phase with said fourth clock signal, whereby activating timing for the data reading operation provided by said first control signal is different from the activating timing for the data writing operation provided by said second control signal.

20. A serial access memory device, comprising:

a first memory cell array having a plurality of memory cells, a first shift register for latching and shifting a series of read-out data in reading out the series of read-out data from a series of memory cells of said first memory cell array and for latching and shifting a series of written-in data in writing the series of written-in data into a series of memory cells of said first memory cell array;

a first output buffer connected to an output node of said first shift register for providing the read-out data latched in said first register to an output node of said memory device, based on a first clock signal;

a first input buffer receiving incoming data for providing selectively data to be written into the series of memory cells of said first memory cell array among said incoming data, based on a second clock signal;

a second memory cell array having a plurality of memory cells, a second shift register for latching and shifting a series of read-out data in reading out the series of read-out data out of a series of memory cells of said second memory cell array and for latching and shifting a series of written-in data in writing the series of written-in data into a series of memory cells of said second memory cell array;

a second output buffer connected to said second shift register for providing the read-out data latched in said second shift register to said output node of said memory device, based on a third clock signal delayed in the phase to said first clock signal;

a second input buffer receiving the incoming data for providing selectively among the incoming data the data to be written into a series of memory cells of said second memory cell array of said second shift register, based on a fourth clock signal delayed in the phase to said second clock signal;

means for generating a first control signal in phase with said first clock signal and thereby in synchronization with operation of said first output buffer in the data reading operation, for controlling the shifting of data latched in said first and second shift registers in reading out the data of the series of memory cells of said first memory cell array latched in said first shift register and the data of the series of memory cells of said second memory cell array latched in said second shift register; and means for generating a second control signal for controlling the respective shiftings of data from said first and second input buffers to said first and second shift registers, said second control signal being in phase with said fourth clock signal and in synchronization with operation of the second input buffer in the data writing operation.

21. A method for accessing a serially accessible memory device, said memory device including:

a memory cell array divided into a plurality of blocks, a plurality of register means each provided corresponding to each said plurality of blocks for receiving and sending data from and to memory cells on a selected row in the corresponding block, each of said plurality of register means being capable of data latching and shifting data, a plurality of input buffer means each provided separately corresponding to each said plurality of register means for serially transmitting externally applied data to the corresponding register, said plurality of input buffer means receiving different data from each other in a sequential dat stream, a plurality of output buffer means each provided corresponding to each of said plurality of register means for serially outputting the data received from the corresponding register means, wherein timing of the activation of the input buffer means and the output buffer means for each of the memory cell array blocks is different, said method including the steps of:

providing an external clock signal and a write/read enabling signal;

generating an internal clock signal in response to said external clock signal, said generating step including providing clock signals different in activating timing for a dat writing operation and a data reading operation; and applying said internal clock signal in common to said plurality of register means, so that a shifting operation in each of said plurality of register means is performed in response to the same internal clock signal.

22. A method for accessing a serially accessible memory device, said memory device including:

a memory cell array divided into a plurality of blocks, a plurality of register means each provided corresponding to each said plurality of blocks for receiving and sending dat from and to among cells on a selected row in the corresponding block, each of said plurality of register means being capable of data latching and shifting data, a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output buffer means for each of the memory cell array blocks is different, said method including the steps of:

providing an external clock signal and a write/read enabling signal;

generating an internal clock signal in response to said external clock signal by (i) providing a clock signal as said internal clock signal in synchronization with operation of a first activated output buffer means among said plurality of output buffer means in a data reading operation, and (ii) providing a clock signal as said internal clock signal in synchronization with operation of one input buffer means among said plurality of input means in a data writing operation; and applying said internal clock signal in common to said plurality of register means, so that a shifting operation in each of said plurality of register means is performed in response to the same internal clock signal.

23. A video random access memory device (VRAM) for reading and writing pixel data, comprising:

a memory cell array divided into a plurality of blocks, a plurality of register means each provided corresponding to each said plurality of blocks for receiving an sending data from and to memory cells on a selected row in the corresponding block, each of said plurality of register means including means for data latching and shifting data, a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register mean for serially outputting the data received from the corresponding register means, wherein timing of the activation of the input buffer means and the output buffer means for each of the memory cell array blocks is different, means for dividing down a chrominance subcarrier; and means responsive to said divided down chrominance subcarrier and a write/read enabling signal for deriving an internal clock signal, wherein said internal clock signal deriving mean include means for providing a write clock signal having a first activating timing for a data writing operation and providing a read clock signal having a second activating timing, different from said first activating timing, for a data reading operation;

wherein said internal clock signal is applied in common to said plurality of register means, so that a shifting operation in each of said plurality of register means is performed in response to the same internal clock signal.

24. A video random access memory device (VRAM) for reading and writing pixel data, comprising:

a memory cell array divided into a plurality of blocks, a plurality of register means each provided corresponding to each said plurality of blocks for receiving and sending data from and to memory cells on a selected row in the corresponding block, each of said plurality of register means including means for dat latching and shifting data, a plurality of input buffer means provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output buffer means for each of the memory cell array blocks is different, means for dividing down a chrominance subcarrier; and means responsive to said divided down chrominance subcarrier and a write/read enabling signal for deriving an internal clock signal, wherein said internal clock signal deriving means include (i) means for providing a clock signal as said internal clock signal in synchronization with operation of a first activated output buffer means among said plurality of output buffer means in a data reading operation, and (ii) means for providing a clock signal as said internal clock signal in synchronization with operation of one input buffer means among said plurality of input means in a data writing operation;

wherein said internal clock signal is applied in common to said plurality of register means, so that a shifting operation in each of said plurality of register means is performed in response to the same internal clock signal.

25. A video random access memory comprising:

a first memory cell array having a plurality of memory cells, a first shift register for latching and shifting a series of read-out data in reading out the series of read-out data from a series of memory cells of said first memory cell array and for latching and shifting a series of written-in data in writing the series of written-in data into a series of memory cells of said first memory cell array;

a first output buffer connected to an output node of said first shift register for providing the read-out data latched in said first register to an output node of said memory device, based on a first clock signal;

a first input buffer receiving incoming data for providing selectively data to be written into the series of memory cells of said first memory cell array among said incoming data, based on a second clock signal;

a second memory cell array having a plurality of memory cells, a second shift register for latching and shifting a series of read-out data in reading out the series of read-out data out of a series of memory cells of said second memory cell array and for latching and shifting a series of written-in data in writing the series of written-in data into a series of memory cells of said second memory cell array;

a second output buffer connected to said second shift register for providing the read-out data latched in said second shift register to said output node of said memory device, based on a third clock signal delayed in the phase to said first clock signal;

a second input buffer receiving the incoming data for providing selectively among the incoming data the data to be written into a series of memory cells of said second memory cell array to said second shift register, based on a fourth clock signal delayed in the phase to said second clock signal;

means for generating a first control signal in phase with said first clock signal and thereby in synchronization with operation of said first output buffer in the data reading operation, for controlling the shifting of data latched in said first and second shift registers in reading out the data of the series of memory cells of said first memory cell array latched in said first shift register and the data of the series of memory cells of said second memory cell array latched in said second shift register;

means for generating a second control signal for controlling the respective shiftings of data from said first and second input buffers to said first and second shift registers, said second control signal being in phase with said fourth clock signal; and means for generating said first and second clock signals by dividing down a chrominance subcarrier externally applied, whereby activating timing for the data reading operation provided by said first control signal is different from the activating timing for the data writing operation provided by said second control signal.

26. A video random access memory comprising:

a first memory cell array having a plurality of memory cells, a first shift register for latching and shifting a series of read-out data in reading out the series of read-out data from a series of memory cells of said first memory cell array and for latching and shifting a series of written-in data in writing the series of written-in data into a series of memory cells of said first memory cell array;

a first output buffer connected to an output node of said first shift register for providing the read-out data latched in said first register to an output node of said memory device, based on a first clock signal;

a first input buffer receiving incoming data for providing selectively data to be written into the series of memory cells of said first memory cell array among said incoming data, based on a second clock signal;

a second memory cell array having a plurality of memory cells, a second shift register for latching and shifting a series of read-out data in reading out the series of read-out data out of a series of memory cells of said second memory cell array and for latching and shifting a series of written-in data in writing the series of written-in data into a series of memory cells of said second memory cell array;

a second output buffer connected to said second shift register for providing the read-out data latched in said second shift register to said output node of said memory device, based on a third clock signal delayed in the phase to said first clock a second input buffer receiving the incoming data for providing selectively among the incoming data the data to be written into a series of memory cells of said second memory cell array to said second shift register, based on a fourth clock signal delayed in the phase to said second clock signal;

means for generating a first control signal in phase with said first clock signal, for controlling the shifting of data latched in said first and second shift registers in reading out the data of the series of memory cells of said first memory cell array latched in said first shift register and the data of the series of memory cells of said second memory cell array latched in said second shift register;

means for generating a second control signal for controlling the respective shiftings of data from said first and second input buffers to said first and second shift registers, said second control signal being in phase with said fourth clock signal and in synchronization with operation of the second input buffer in the data writing operation; and means for generating said first and second clock signals by dividing down a chrominance subcarrier externally applied.

27. A method for serially accessing a video random access memory, said random access memory comprising:

a memory cell array divided into a plurality of blocks, a plurality of register means each provided corresponding to each said plurality of blocks for receiving and sending data from and to memory cells on a selected row in the corresponding block, each of said plurality of register means being capable of data latching and shifting data operations, a plurality of input holder means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register mean for serially outputting the data received from the corresponding register means, wherein timing of the activation of the input buffer means and the output buffer means for each of the memory cell array blocks is different, said method including the steps of:

dividing down a chrominance subcarrier externally applied;

deriving an internal clock signal in response to said divided down chrominance subcarrier and a read/write enabling signal externally applied, said deriving step including providing clock signals different in activating timing of a data writing operation and the data reading operation; and applying said internal clock signal in common to said plurality of register means, so that a shifting operation in each of said plurality of register means is performed in response to the same internal clock signal.

28. A method for serially accessing a video random access memory, said random access memory comprising:

a memory cell array divided into a plurality of blocks, a plurality of register means each provided corresponding to each said plurality of blocks for receiving and sending data from and to memory cells on a selected row in the corresponding block, each of said plurality of register means being capable of data latching and shifting data operations, a plurality of input buffer means each provided separately corresponding to each said plurality of register means for serially transmitting externally applied data to the corresponding register, said plurality of input buffer means receiving different data from each other in a sequential data stream, a plurality of output buffer means each provided corresponding to each of said plurality of register means for serially outputting the data received from the corresponding register means, wherein timing of the activation of the input buffer means and the output buffer means for each of the memory cell array blocks is different, said method including the steps of:

dividing down a chrominance subcarrier externally applied;

deriving an internal clock signal in response to said divided down chrominance subcarrier and a read/write enabling signal externally applied by (i) providing a clock signal as said internal clock signal in synchronization with operation of a first activated output buffer means among said plurality of output buffer means in a data reading operation, and (ii) providing a clock signal as said internal clock signal is synchronization with operation of one input buffer means among said plurality of input means in a data writing operation; and applying said internal clock signal in common to said plurality of register means, so that a shifting operation in each of said plurality of register means is performed in response to the same internal clock signal.

* * * * *